(12) United States Patent
Seymour et al.

(10) Patent No.: US 10,813,240 B2
(45) Date of Patent: Oct. 20, 2020

(54) CONTROL BOX INCLUDING A WATER RESISTANT SEAL

(71) Applicant: Carrier Corporation, Palm Beach Gardens, FL (US)

(72) Inventors: Charles A. Seymour, Clayton, IN (US); Ron A. Wilson, Greenwood, IN (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 16/659,758

(22) Filed: Oct. 22, 2019

(65) Prior Publication Data

US 2020/0187374 A1 Jun. 11, 2020

Related U.S. Application Data

(60) Provisional application No. 62/775,423, filed on Dec. 5, 2018.

(51) Int. Cl.
| | |
|---|---|
| *H05K 5/03* | (2006.01) |
| *H05K 5/06* | (2006.01) |
| *H05K 5/02* | (2006.01) |
| *H05K 7/20* | (2006.01) |

(52) U.S. Cl.
CPC .......... *H05K 5/069* (2013.01); *H05K 5/0217* (2013.01); *H05K 5/03* (2013.01); *H05K 7/209* (2013.01)

(58) Field of Classification Search
CPC .................................................... H05K 5/03
USPC ........................................................ 174/175
See application file for complete search history.

(56) References Cited

U.S. PATENT DOCUMENTS

| | | | |
|---|---|---|---|
| 6,768,054 B2 | 7/2004 | Sati et al. | |
| 7,120,030 B2 | 10/2006 | Azumi et al. | |
| 7,643,297 B2 | 1/2010 | Tominaga et al. | |
| 7,710,714 B2 | 5/2010 | Rapp et al. | |
| 7,751,193 B2 | 7/2010 | Tominaga et al. | |
| 7,782,618 B2 | 8/2010 | Hata et al. | |
| 7,791,888 B2 | 9/2010 | Tominaga et al. | |
| 7,936,566 B2 | 5/2011 | Shigyo et al. | |
| 7,944,697 B2 | 5/2011 | Hata et al. | |
| 8,358,516 B2 * | 1/2013 | Weiss .................. | H05K 5/0204 361/825 |
| 8,520,397 B2 * | 8/2013 | Azumi ................ | H05K 5/0052 361/752 |
| 8,854,827 B2 | 10/2014 | Tanaka et al. | |
| 9,078,367 B2 | 7/2015 | Tamura et al. | |
| 9,301,418 B2 | 3/2016 | Nuriya et al. | |
| 9,462,715 B2 | 10/2016 | Nuriya et al. | |
| 9,480,189 B2 | 10/2016 | Kawai et al. | |
| 9,661,772 B2 | 5/2017 | Nuriya et al. | |
| 9,730,349 B2 | 8/2017 | Nuriya et al. | |
| 9,844,140 B2 | 12/2017 | Oba | |

(Continued)

FOREIGN PATENT DOCUMENTS

| | | |
|---|---|---|
| EP | 1724839 | 7/2008 |
| EP | 1874103 | 8/2011 |

*Primary Examiner* — Stanley Tso
(74) *Attorney, Agent, or Firm* — Carlson, Gaskey & Olds, P.C.

(57) ABSTRACT

An enclosure includes a housing having an opening and a seal land adjacent to the opening. A cover has a plurality of ribs and is configured to be fastened to the housing to cover the opening such that the plurality of ribs are sealingly engaged against the seal land.

13 Claims, 4 Drawing Sheets

(56) References Cited

U.S. PATENT DOCUMENTS

| | | |
|---|---|---|
| 9,949,394 B2 | 4/2018 | Kamoshida et al. |
| 2009/0200489 A1* | 8/2009 | Tappel .................. H05K 5/069 |
| | | 250/492.3 |
| 2015/0098200 A1* | 4/2015 | Spangberg ........... H05K 7/1427 |
| | | 361/752 |
| 2017/0013737 A1* | 1/2017 | Kawabe ................ H05K 5/061 |
| 2018/0213658 A1 | 6/2018 | Nuriya |

* cited by examiner

CONTROL BOX INCLUDING A WATER RESISTANT SEAL

CROSS-REFERENCE TO RELATED APPLICATIONS

This application claims priority to U.S. Provisional Application No. 62/775,423, which was filed on Dec. 5, 2018 and is incorporated herein by reference.

BACKGROUND

This application relates to a control box and cover.

Electronics for certain purposes are frequently housed outdoors in purpose-built enclosures. Examples include control boxes and air conditioning units. The enclosures may have separately installed panels, such trays as for inverters for use with the housed electronics. The enclosures are provided with openings to accommodate the separately installed panels.

Even with the panels installed, the openings create a potential for weather infiltration into the enclosure, particularly by rain, which can interfere with the function of the electronics. Independent certification standards have been established for how much weather infiltration is permissible for certain applications. As such, known inverter trays and the like are typically installed with an additional sealant. For example, a liquid or foam sealant may be applied between the tray and the enclosure to prevent weather infiltration. Such additional sealant introduces additional labor and material cost, which is undesirable.

SUMMARY

In a featured embodiment, an enclosure includes a housing having an opening and a seal land adjacent to the opening. A cover has a plurality of ribs and is configured to be fastened to the housing to cover the opening such that the plurality of ribs are sealingly engaged against the seal land.

In another embodiment according to the previous embodiment, the ribs create at least two separate lines of sealing engagement around a perimeter of the cover.

In another embodiment according to any of the previous embodiments, the housing has one or more inner edges surrounding the opening, and at least one of the inner edges includes a flange extending toward the cover to sealingly engage against the cover when the cover is fastened to the housing.

In another embodiment according to any of the previous embodiments, the seal land defines a plane, and the flange extends at least partially in a direction perpendicular to the plane.

In another embodiment according to any of the previous embodiments, the ribs and the flange provide at least three separate lines of sealing engagement around a perimeter of the cover.

In another embodiment according to any of the previous embodiments, the cover has one or more outer edges, and the plurality of ribs extends along each of the one or more outer edges.

In another embodiment according to any of the previous embodiments, at least one of the outer edges has a notch, and one of the ribs follows the notch.

In another embodiment according to any of the previous embodiments, the housing is a control box and the tray is an inverter tray.

In another embodiment according to any of the previous embodiments, the cover includes an inverter box and a heat sink integrated with the inverter box. The heat sink extends into an interior of the enclosure when the cover is fastened to the housing.

In another embodiment according to any of the previous embodiments, the housing has first fastener holes and the cover has second fastener holes corresponding to the first fastener holes.

In another embodiment according to any of the previous embodiments, at one of the fastener holes is between two of the ribs.

In another embodiment according to any of the previous embodiments, the housing and seal land are constructed primarily of a first material, and the cover and plurality of ribs are constructed primarily of a second material.

In another embodiment according to any of the previous embodiments, the first material is a metal, and the second material is a plastic or a resin.

In another embodiment according to any of the previous embodiments, the seal land and plurality of ribs each include a rigid material.

In another embodiment according to any of the previous embodiments, the ribs are elastically deformed by pressure against the seal land.

In another featured embodiment, an enclosure includes a housing having an opening, a tray having outer edges and a plurality of ribs extending along each outer edge of the tray. The tray is configured to be fastened to the housing such that the plurality of ribs are sealingly engaged against the housing to form a sealed perimeter around the opening.

In another embodiment according to the previous embodiment, the housing has one or more inner edges surrounding the opening. At least one of the inner edges includes a flange extending outward from the housing to sealingly engage against the tray when the tray is fastened to the housing.

In another embodiment according to any of the previous embodiments, an exterior surface of the housing provides a planar seal land along the inner edges and the plurality of ribs sealingly engage against the seal land when the tray is fastened to the housing.

In another embodiment according to any of the previous embodiments, the plurality of ribs extend mutually parallel along each of the outer edges.

In another embodiment according to any of the previous embodiments, the plurality of ribs includes a first rib and a second rib, and the tray includes a fastener hole between the first rib and the second rib.

These and other features may be best understood from the following drawings and specification.

DETAILED DESCRIPTION

Figure 1:
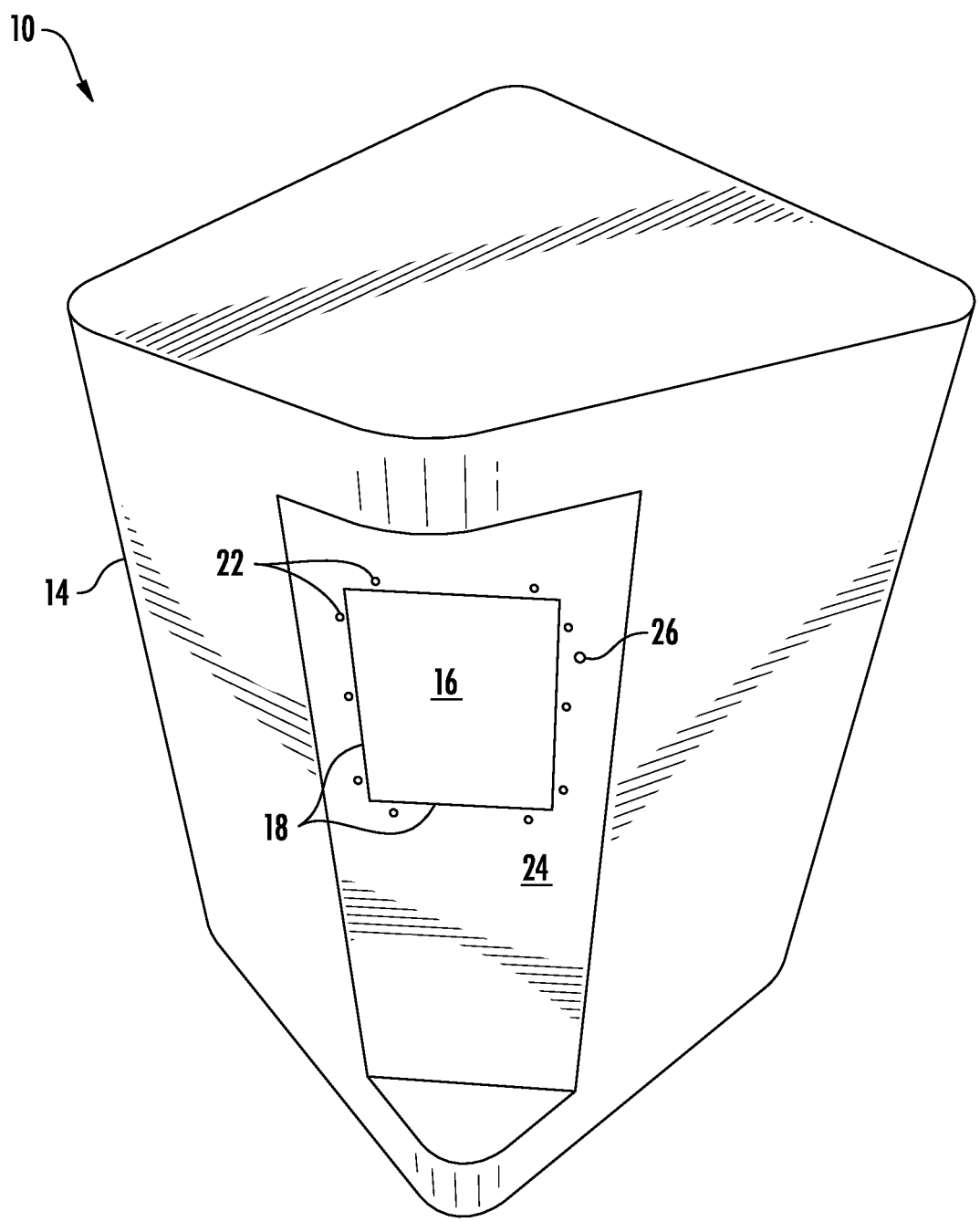
FIG. 1 illustrates a control box.

FIG. 1 shows an enclosure 10 that includes a housing 14 with an opening 16. The housing 14 has inner edges 18 around the opening 16. In this example the inner edges 18 are surrounded by housing fastener holes 22. In the illustrated example, a cable hole 26 is located near the opening 16. The housing 14 has an exterior face 24 facing away from an interior space within the enclosure 10. The enclosure 10 may for example be a control box or air conditioning unit.

Figure 2:
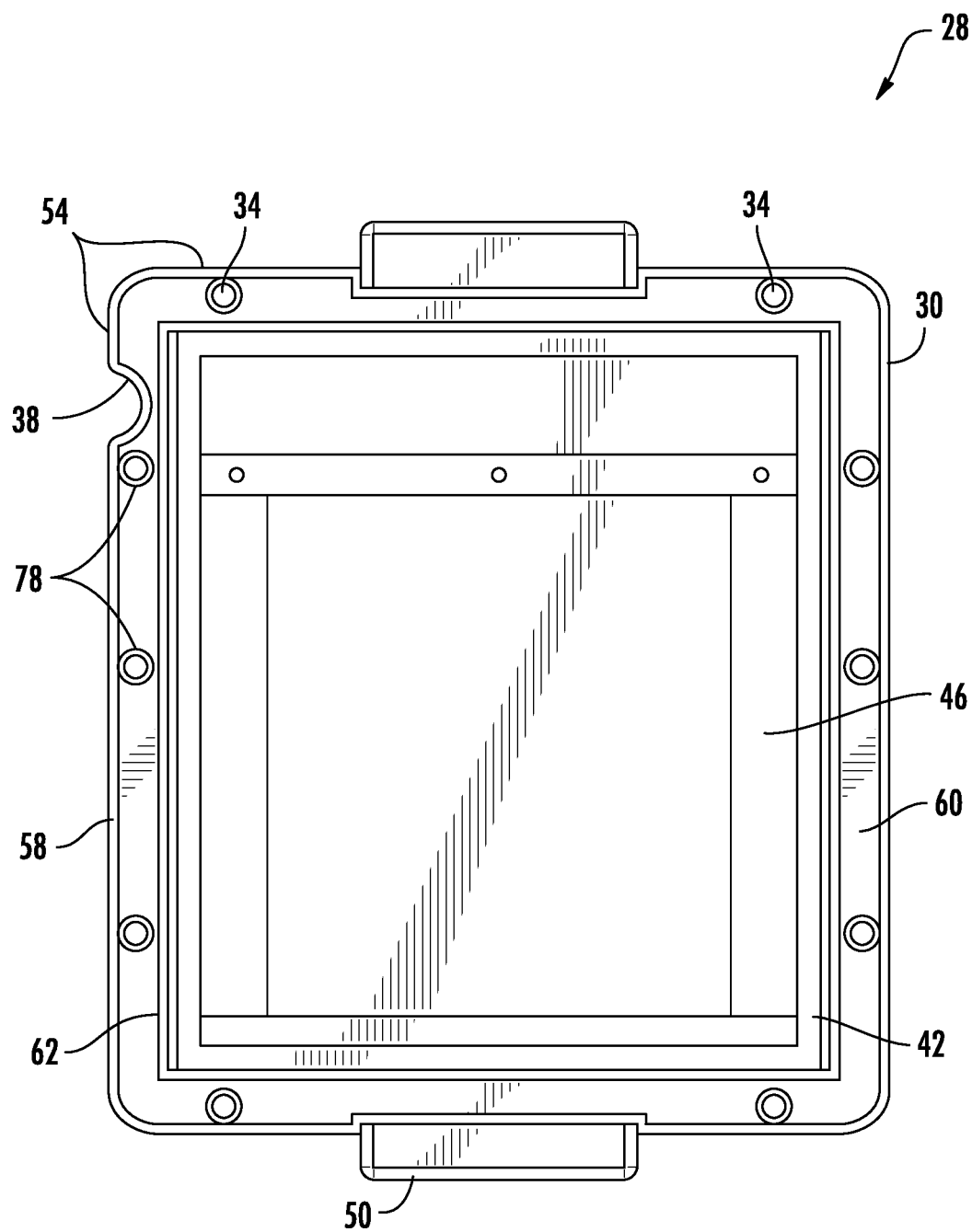
FIG. 2 illustrates a cover for the control box.

FIG. 2 shows a cover 28 for the opening 16. An interior face 60 of the cover is shown in FIG. 2. The cover 28 includes a tray 30 with outer edges 54. The tray 30 further includes tray fastener holes 34 around the outer edges 54. According to the illustrated embodiment, tabs 50 are located at the outer edges 54 to aid handling and installation. At least one of the outer edges 54 includes a notch 38 to be situated near the cable hole 26, such that the cover 28 could, for example, accommodate a cable extending through the cable hole 26.

In the illustrated example, the tray 30 is an inverter tray. An inverter box 42 may be located on or fastened to the tray 30. A heat sink 46 is integrated with inverter box 42 to dissipate heat from an inverter within the inverter box 42.

The tray 30 includes an outer rib 58 adjacent to the outer edges 54, and an inner rib 62 offset inward from the outer rib 58. In the illustrated example, the tray 30 defines a plane and the ribs 58, 62 extend an equal or approximately equal distance perpendicular to the plane. Both the outer rib 58 and inner rib 62 generally extend along the outer edges 54 and are located on the interior face 60 of the tray 30. According to the illustrated embodiment, the outer rib 58 defines a perimeter outside of the tray fastener holes 34, while the inner rib 62 defines a perimeter inside the tray fastener holes 34, so the tray fastener holes 34 are between the two ribs 58, 62.

In the illustrated example, the outer rib 58 follows the shape of the notch 38. Thus, in the illustrated example the outer rib 58 and inner rib 62 are parallel except near the notch 38 and coextensive around a perimeter of the outer edges 54. In another example, the outer rib 58 and inner rib 62 are parallel and coextensive around the outer edges 54. The ribs 58, 62 thereby create two separate lines of sealing engagement.

Figure 3:
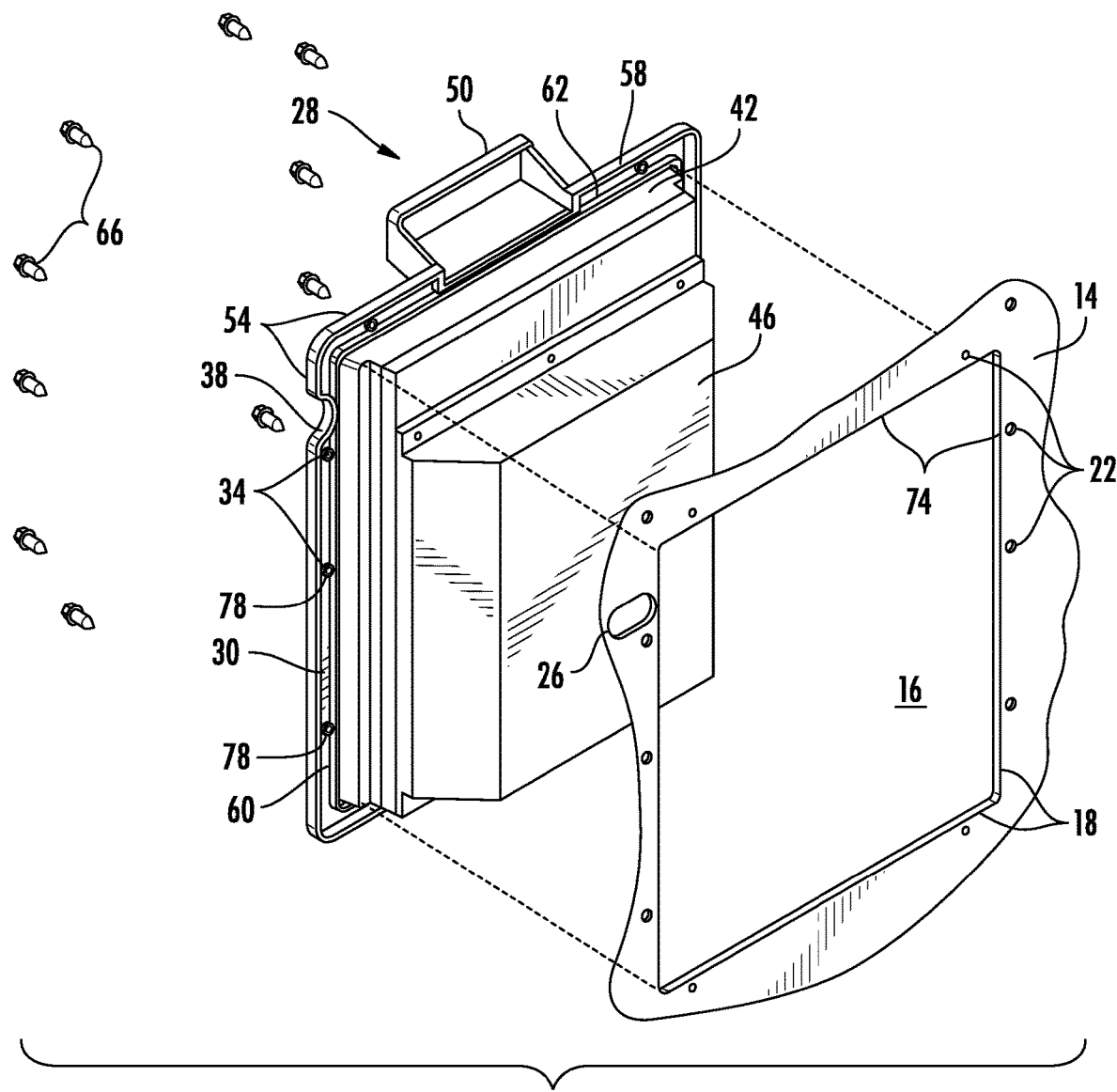
FIG. 3 is an oblique view of the cover aligned with an opening in the control box.

FIG. 3 shows a cutaway portion of the housing 14 and the cover 28 is situated to be placed in position to close the opening 16. The cover 28 is configured to be fastened to the housing 14 to span and seal the opening 16. The notch 38 is aligned with the cable hole 26 when the cover 28 is installed. Bosses 78 extend from the interior face 60 and are located concentrically with each tray fastener hole 34.

Fasteners 66 are provided to extend through each of the tray fastener holes 34 and corresponding housing fastener holes 22. According to the illustrated embodiment, the fasteners 66 are rivets. Other fasteners 66 are contemplated, such as screws. The fasteners 66 are chosen and the fastener holes 22, 34 are shaped to cooperate to bind the tray 30 tightly against the housing 14.

Figure 4:
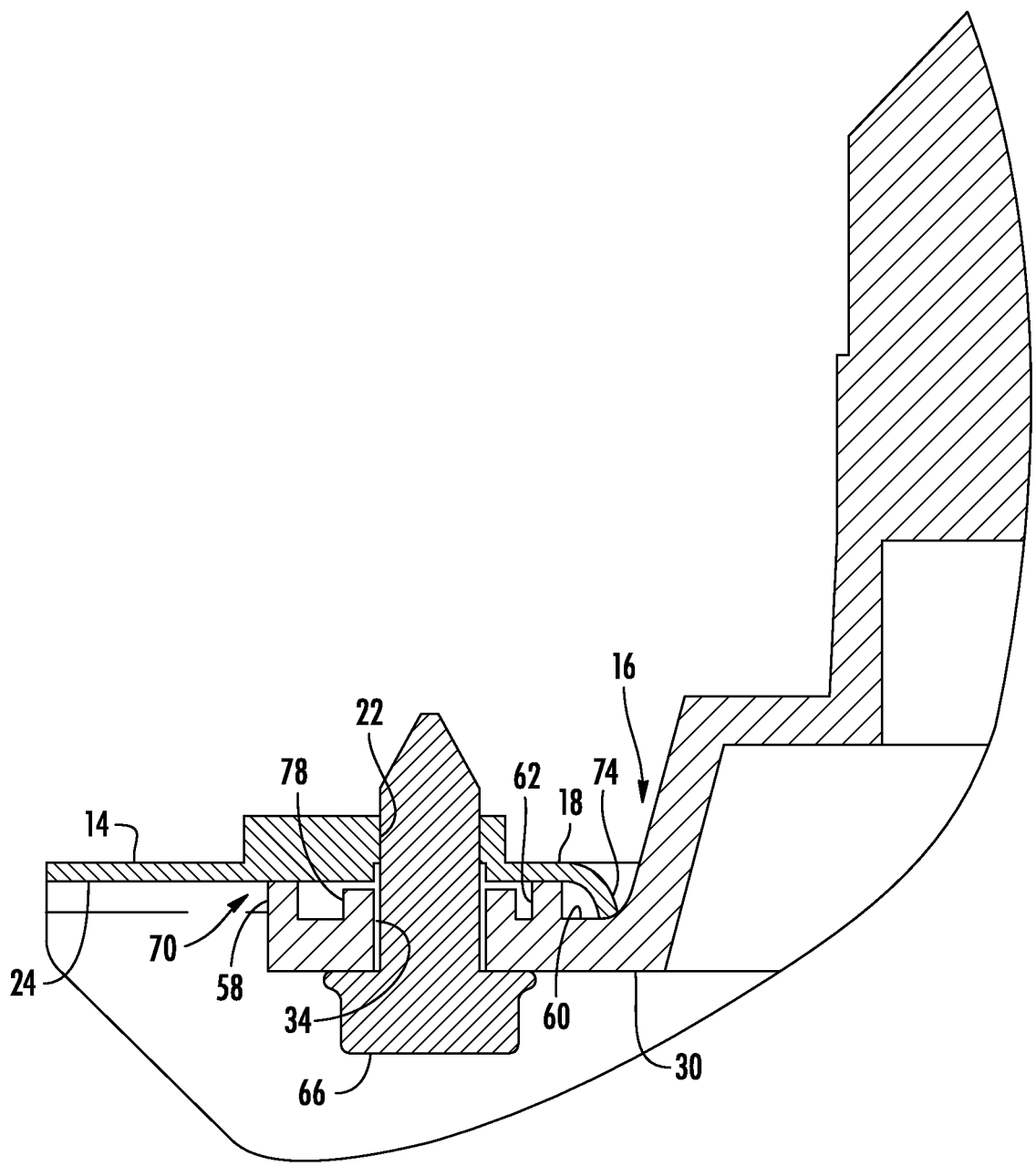
FIG. 4 is a close cross-sectional view of the cover fastened to the control box.

FIG. 4 is a cross-section view of a portion of the interface between the cover 28 and the housing 14. A fastener 66 extends through a tray fastener hole 34 and corresponding housing fastener hole 22. According to the illustrated embodiment, the tray fastener hole 34 extends through the boss 78 protruding from the tray 30 toward the housing 14. The fastener 66 joins the tray 30 tightly to the housing 14 such that the outer rib 58 and inner rib 62 are sealingly engaged against a seal land 70 provided by the exterior face 24 of the housing 14 near the inner edge 18. The boss 78 however does not contact the housing 14 in this embodiment. A flange 74 surrounding the opening 16 extends toward and is engaged against the tray 30. The seal land 70 provided by the exterior face 24 of the housing 14 defines a plane, and the flange 74 extends at least partially in a direction perpendicular to the plane.

According to an exemplary embodiment, the tray 30 is constructed primarily from a rigid plastic such as injection molded polypropylene. The plastic construction allows the tray 30 to be generally rigid while undergoing some elastic deformation in regions of acute stress. For example, the outer rib 58 and inner rib 62 undergo slight elastic deformation when engaged against the seal land 70 by the fastener 66. The deformation of the ribs 58, 62 against the seal land 70 corrects for any irregularities on the ribs 58, 62 so the entire length of both ribs 58, 62 contacts the housing 14 to establish a water-resistant seal. The two ribs 58, 62 thus cooperate to form a sealed perimeter around the opening 16 when the tray 30 is fastened to the housing 14.

The housing 14 in this example is constructed primarily from metal, which may be painted or otherwise provided with a weather resistant coating. Metal is also generally rigid while capable of exhibiting elastic deformation in regions of acute stress. Cooperating with the elastic deformation of the tray 30, the flange 74 creates a further sealed perimeter around the opening 16 to additionally contribute to sealing the opening 16 from weather infiltration. The flange 74 is at least parallel and coextensive with the ribs 58, 62 creating three separate lines of sealing engagement.

The example enclosure 10 can be sealed closed against rain or other weather infiltration according to industry standards without any need for application of liquid or foam sealants. Further, the sealing is achieved with a housing 14 and tray 30 each of substantially unitary construction. For example, the seal land 70 of the illustrated embodiment is a region of the exterior face 24 of the housing 14, and is therefore constructed entirely or primarily of the same metal as the rest of the housing 14. Similarly, the ribs 58, 62 are constructed entirely or primarily of the same plastic as the tray 30. While other embodiments may have a seal land 70 or ribs 58, 62 of softer material than the housing 14 and tray 30, respectively, to further contribute to sealing, for example, the illustrated embodiment provides sufficient sealing with a seal land 70 of unitary construction with the housing 14, and ribs 58, 62 of unitary construction with the tray 30.

Although an embodiment of this invention has been disclosed, a worker of ordinary skill in this art would recognize that certain modifications would come within the scope of this disclosure. For that reason, the following claims should be studied to determine the true scope and content of this disclosure.

The invention claimed is:

1. An enclosure for an outdoor air conditioning unit, comprising:
   a housing having an opening and a seal land adjacent to the opening, wherein the housing is a control box; and
   a cover having a plurality of ribs and configured to be fastened to the housing to cover the opening such that the plurality of ribs are sealingly engaged against the seal land, wherein the cover includes an inverter box and a heat sink integrated with the inverter box, and the heat sink extends into an interior of the enclosure when the cover is fastened to the housing;
   wherein the housing has first fastener holes and the cover has second fastener holes corresponding to the first fastener holes, and at least one of the fastener holes is between two of the ribs; and
   wherein the housing and seal land are constructed primarily of a first material, and the cover and plurality of ribs are constructed primarily of a second material, and wherein the first material is a metal, and the second material is a plastic or a resin.

2. The enclosure of claim 1, wherein the ribs create at least two separate lines of sealing engagement around a perimeter of the cover.

3. The enclosure of claim 1, wherein the housing has one or more inner edges surrounding the opening, and at least one of the inner edges includes a flange extending toward the cover to sealingly engage against the cover when the cover is fastened to the housing.

4. The enclosure of claim 3, wherein the seal land defines a plane, and the flange extends at least partially in a direction perpendicular to the plane.

5. The enclosure of claim 3, wherein the ribs and the flange provide at least three separate lines of sealing engagement around a perimeter of the cover.

6. The enclosure of claim 1, wherein the cover has one or more outer edges, and the plurality of ribs extends along each of the one or more outer edges.

7. The enclosure of claim 6, wherein at least one of the outer edges has a notch, and one of the ribs follows the notch.

8. The enclosure of claim 1, wherein the seal land and plurality of ribs each comprise a rigid material.

9. The enclosure of claim 8, wherein the ribs are elastically deformed by pressure against the seal land.

10. An enclosure for an outdoor air conditioning unit, comprising:
 a housing having an opening and a planar seal land adjacent to the opening, wherein the housing is a control box;
 a tray having outer edges and a plurality of ribs extending along each outer edge of the tray; wherein
 the tray is configured to be fastened to the housing such that the plurality of ribs are sealingly engaged against the housing to form a sealed perimeter around the opening, wherein the tray includes an inverter box and a heat sink integrated with the inverter box, and the heat sink extends into an interior of the enclosure when the tray is fastened to the housing;
 wherein the housing has first fastener holes and the tray has second fastener holes corresponding to the first fastener holes, and at least one of the fastener holes is between two of the ribs; and
 wherein the housing and seal land are constructed primarily of a first material, and the tray and plurality of ribs are constructed primarily of a second material, and wherein the first material is a metal, and the second material is a plastic or a resin.

11. The enclosure of claim 10, wherein the housing has one or more inner edges surrounding the opening, and at least one of the inner edges includes a flange extending outward from the housing to sealingly engage against the tray when the tray is fastened to the housing.

12. The enclosure of claim 11, wherein an exterior surface of the housing provides the planar seal land along the inner edges and the plurality of ribs sealingly engage against the seal land when the tray is fastened to the housing.

13. The enclosure of claim 10, wherein the plurality of ribs extend mutually parallel along each of the outer edges.

* * * * *